US008709946B2

(12) United States Patent
Tsai et al.

(10) Patent No.: US 8,709,946 B2
(45) Date of Patent: Apr. 29, 2014

(54) METHOD FOR FORMING CONTACT HOLE

(75) Inventors: Meng-Feng Tsai, New Taipei (TW);
Yi-Shiang Chang, Changhua County (TW); Chia-Chi Lin, Hsinchu County (TW); I-Hsin Chen, Taoyuan County (TW); Chia-Ming Wu, Taipei (TW)

(73) Assignee: Powerchip Technology Corporation, Hsinchu (TW)

( * ) Notice: Subject to any disclaimer, the term of this patent is extended or adjusted under 35 U.S.C. 154(b) by 140 days.

(21) Appl. No.: 13/364,252

(22) Filed: Feb. 1, 2012

(65) Prior Publication Data

US 2013/0137270 A1    May 30, 2013

(30) Foreign Application Priority Data

Nov. 24, 2011    (TW) .............................. 100143036 A

(51) Int. Cl.
*H01L 21/44*    (2006.01)
(52) U.S. Cl.
USPC .......................................... 438/668; 438/702
(58) Field of Classification Search
USPC .................................................. 438/668, 702
See application file for complete search history.

(56) References Cited

U.S. PATENT DOCUMENTS

| | | | | |
|---|---|---|---|---|
| 5,328,810 A * | 7/1994 | Lowrey et al. | ................. | 430/313 |
| 6,063,688 A * | 5/2000 | Doyle et al. | .................... | 438/424 |
| 6,383,952 B1 * | 5/2002 | Subramanian et al. | ........ | 438/781 |
| 6,486,058 B1 | 11/2002 | Chun | | |
| 7,576,010 B2 * | 8/2009 | Lee et al. | ...................... | 438/717 |
| 7,615,496 B2 * | 11/2009 | Lee et al. | ...................... | 438/736 |
| 7,786,015 B2 * | 8/2010 | Chen et al. | ..................... | 438/703 |
| 7,902,074 B2 * | 3/2011 | Niroomand et al. | .......... | 438/702 |
| 7,981,592 B2 | 7/2011 | Chan | | |
| 8,003,543 B2 * | 8/2011 | Koh et al. | ...................... | 438/717 |
| 8,048,762 B2 * | 11/2011 | Ohuchi | .......................... | 438/424 |
| 8,133,547 B2 * | 3/2012 | Jung | ................. | 427/487 |
| 8,298,928 B2 * | 10/2012 | Yanagidaira et al. | .......... | 438/599 |
| 8,298,943 B1 * | 10/2012 | Arnold et al. | .................. | 438/667 |
| 8,426,314 B2 * | 4/2013 | Kim | ................................ | 438/703 |
| 2003/0102285 A1 | 6/2003 | Nozaki et al. | | |
| 2006/0073420 A1 | 4/2006 | Nozaki et al. | | |
| 2007/0161251 A1 * | 7/2007 | Tran et al. | ...................... | 438/725 |
| 2008/0048333 A1 * | 2/2008 | Seo et al. | ....................... | 257/773 |
| 2008/0113300 A2 | 5/2008 | Choi et al. | | |
| 2009/0152645 A1 * | 6/2009 | Tran | ............................... | 257/401 |
| 2009/0317748 A1 * | 12/2009 | Choi | ............................... | 430/312 |
| 2010/0048024 A1 * | 2/2010 | Sugimura | ...................... | 438/702 |
| 2010/0062380 A1 * | 3/2010 | Takemura et al. | ............. | 430/326 |
| 2010/0197139 A1 * | 8/2010 | Koh et al. | | |
| 2011/0033799 A1 * | 2/2011 | Watanabe et al. | ........... | 430/270.1 |
| 2012/0208361 A1 * | 8/2012 | Ha | .................................. | 438/597 |
| 2012/0252185 A1 * | 10/2012 | Lee et al. | ........................ | 438/424 |
| 2013/0171821 A1 * | 7/2013 | Kim et al. | ...................... | 438/675 |

* cited by examiner

*Primary Examiner* — Yu-Hsi D Sun
*Assistant Examiner* — Grant Withers
(74) *Attorney, Agent, or Firm* — Jianq Chyun IP Office

(57) ABSTRACT

A method for forming contact holes includes following steps. A substrate including a dense region and an isolation region is provided. A material layer is formed on the substrate. Sacrificed patterns are formed on the material layer in the dense region, wherein there is a first opening between the two adjacent sacrificed patterns. A spacer is formed on each of two sides of each of the sacrificed patterns, wherein the spacers are separated from each other. The sacrificed patterns are removed to form a second opening between two adjacent spacers. A planar layer is formed to fill up the second openings. A first slit is formed in the planar layer, wherein the first slit exposes a portion of the material layer under the second openings. The portion of the material layer exposed by the first slit is removed to form third openings in the material layer.

13 Claims, 4 Drawing Sheets

METHOD FOR FORMING CONTACT HOLE

CROSS-REFERENCE TO RELATED APPLICATION

This application claims the priority benefit of Taiwan application serial no. 100143036, filed on Nov. 24, 2011. The entirety of the above-mentioned patent application is hereby incorporated by reference herein and made a part of this specification.

BACKGROUND OF THE INVENTION

1. Field of Invention

The present invention relates to a method for manufacturing a semiconductor device. More particularly, the present invention relates to a method for forming contact holes.

2. Description of Related Art

Due to the rapid development of integrated circuits, minimizing the device dimension and increasing the integration level have become the mainstream in semiconductor industry, and the key technology is in photolithography. With the increasing of the integration of the semiconductor device, the critical dimension (CD) is decreased. Thus, it is necessary to improve the resolution of the photolithography.

For instance, due to the size reduction, optical properties of material is harder to gauge and the photolithographic process has encountered some machine processing limits and physical limit in optical properties. As a result, the process of fabricating contact holes using photolithographic technique is increasingly difficult.

In order to increase the ability for controlling the critical dimension of the contact holes and decrease the cost, it is necessary to improve the method for forming the contact holes under the conditions of the existing equipments.

SUMMARY OF THE INVENTION

The present invention provides a method for forming contact holes capable of enhancing the ability for controlling the critical dimension of the contact holes.

The invention provides a method for forming contact holes. In the method, a substrate is provided, wherein the substrate includes a dense region and an isolation region. A material layer is formed on the substrate. A plurality of sacrificial patterns is formed on the material layer in the dense region, wherein there is a first opening between two adjacent sacrificial patterns. A spacer is formed on each of two sides of each of the sacrificial patterns, wherein the spacers are separated from each other. The sacrificial patterns are removed to form a second opening between two adjacent spacers A planar layer is formed to fill up the second openings. A first slit is formed in the planar layer, wherein the first slit exposes a portion of the material layer under the second openings. The portion of the material layer exposed by the first slit is removed to form a plurality of third openings in the material layer.

According to one embodiment of the present invention, the step of forming the first slit in the planar layer includes following steps. A first patterned photoresist layer is formed on the planar layer, wherein the first patterned photoresist layer has a second slit and a fourth opening, the second slit exposes a portion of the planar layer in the dense region and the fourth opening exposes a portion of the planar layer in the isolation region. The portions of the planar layer exposed by the second slit and the fourth opening are removed by using the first patterned photoresist layer as a mask so as to form the first slit in the planar layer in the dense region and to form a fifth opening in the planar layer in the isolation region.

According to one embodiment of the present invention, after the step of forming the first patterned photoresist layer and before the step of removing the portions of the planar layer, the method for forming the contact holes further includes performing a shrink process on the fourth opening.

According to one embodiment of the present invention, the shrink process includes a resolution enhancement lithography assisted by chemical shrink (RELACS) process, a photoresist expanding process or a low temperature thin film process.

According to one embodiment of the present invention, during the step of removing the portion of the material layer exposed by the first slit, a portion of the material layer exposed by the fifth opening can be removed to form a sixth opening in the material layer.

According to one embodiment of the present invention, a width of the sixth opening is half of a minimum line width of a photolithography process, for example.

According to one embodiment of the present invention, after the material layer is formed and before the sacrificial patterns are formed, the method for forming the contact holes further includes forming a hard mask layer on the material layer.

According to one embodiment of the present invention, the method for forming the contact holes further includes extending the second openings into the hard mask layer.

According to one embodiment of the present invention, after the material layer is formed and before the sacrificial patterns are formed, the method for forming the contact holes further includes forming a hard mask layer structure on the material layer.

According to one embodiment of the present invention, the method for forming the contact holes further includes forming a plurality of seventh openings in the hard mask layer structure for forming the third openings.

According to one embodiment of the present invention, the hard mask layer structure includes a single-layered hard mask layer or a multi-layered hard mask layer.

According to one embodiment of the present invention, the step of forming the sacrificial patterns includes forming a sacrificial pattern layer on the material layer, forming a second patterned photoresist layer on the sacrificial pattern layer, and removing a portion of the sacrificial pattern layer by using the second patterned photoresist layer as a mask.

According to one embodiment of the present invention, the method for forming the contact holes further includes performing a trim process on the second patterned photoresist layer.

According to one embodiment of the present invention, a ratio of a line width of the second patterned photoresist layer to a line space of the second patterned photoresist layer, after the trim process is performed on the second patterned photoresist layer, is larger than 1:1 and smaller than or equal to 1:3, for example.

According to one embodiment of the present invention, after the sacrificial pattern layer is formed and before the second patterned photoresist layer is formed, the method for forming the contact holes further includes forming a bottom anti-reflection coating (BARC) layer on the sacrificial pattern layer.

According to one embodiment of the present invention, a width of each of the third openings is half of a minimum line width of a photolithography process, for example.

Accordingly, in the method for forming the contact holes provided by the present invention, since the planar layer is formed to fill up the second openings after the second openings are formed, the reliability of the first patterned photoresist layer for defining the first slit in the photolithography process for forming the first slit is relatively better. Thus, the ability for controlling the critical dimension of the contact holes is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

FIGS. 1A through 1H are three-dimensional diagrams schematically illustrating a method for forming contact holes according to one embodiment of the invention.

Figure 1A:
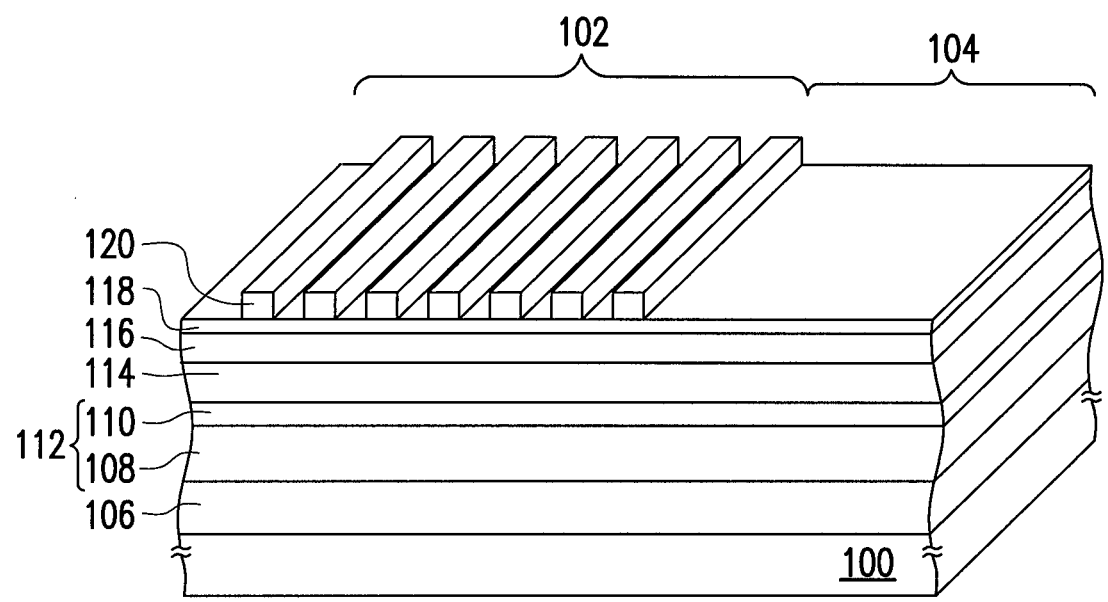
FIGS. 1A through 1H are three-dimensional diagrams schematically illustrating a method for forming contact holes according to one embodiment of the invention.

As shown in FIG. 1A, a substrate 100 is provided. The substrate 100 can be, for example, a silicon substrate. The substrate 100 includes a dense region 102 and an isolation region 104. The dense region 102 can be a region, for example, for forming memory cells. The isolation region 104 can be a region, for example, for the word line of the memory structure to connect to an external electric voltage.

Moreover, a material layer 106 is formed on the substrate 100. The material layer 106 can be made of, for example, dielectric material such as silicon oxide or silicon nitride. The silicon oxide can be, for example, tetraethosiloxane (TEOS). In the present embodiment, the material layer 106 made of tetraethosiloxane is used as an exemplar for description. The method for forming the material layer 106 can be, for example, a chemical vapor deposition.

Further, a hard mask layer 108 can be selectively formed on the material layer 106. The etch selectivity of the hard mask layer 108 is, for example, different from the etch selectivity of the material layer 106. The hard mask layer 108 can be made of, for example, silicon oxy-nitride, amorphous carbon or silicon oxide, wherein the silicon oxide can be, for example, tetraethosiloxane. In the present embodiment, the hard mask layer 108 made of amorphous carbon is used as an exemplar for description. The method for forming the hard mask layer 108 can be, for example, a chemical vapor deposition.

Furthermore, a hard mask layer 110 can be selectively formed on the hard mask layer 108 so as to form a hard mask layer structure 112 on the material layer 106. The etch selectivity of the hard mask layer 110 can be, for example, different from the etch selectivity of the hard mask layer 108. The hard mask layer 110 can be made of, for example, silicon oxy-nitride, amorphous carbon or silicon oxide, wherein the silicon oxide can be, for example, tetraethosiloxane. In the present embodiment, the hard mask layer 110 made of silicon oxy-nitride is used as an exemplar for description. The method for forming the hard mask layer 110 can be, for example, a chemical vapor deposition.

It should be noticed that although, in the present embodiment, the hard mask layer structure 112 which is a multi-layered hard mask layer is used as an exemplar for description, the present invention is not limited to. In other embodiments, the hard mask layer structure 112 can be a single-layered hard mask layer. As long as the contact hole pattern intended to be formed can be effectively transferred into the material layer 106, the number of layers in the hard mask layer structure 112 can be adjusted according to the requirement of the manufacturing process by the people skilled in the art.

Therefore, a hard mask layer 114 can be selectively formed on the hard mask layer 110. The etch selectivity of the hard mask layer 114 can be, for example, different from the etch selectivity of the hard mask layer 110. The hard mask layer 114 can be made of, for example, silicon oxy-nitride, amorphous carbon or silicon oxide, wherein the silicon oxide can be, for example, tetraethosiloxane. In the present embodiment, the hard mask layer 114 made of tetraethosiloxane is used as an exemplar for description. The method for forming the hard mask layer 114 can be, for example, a chemical vapor deposition.

Furthermore, a sacrificial pattern layer 116 is formed on the hard mask layer 114. The etch selectivity of the sacrificial pattern layer 116 can be, for example, different from the etch selectivity of the hard mask layer 114. The sacrificial pattern layer 116 can be made of, for example, amorphous carbon or poly silicon. The method for forming the sacrificial pattern layer 116 can be, for example, a chemical vapor deposition.

Thereafter, a bottom anti-reflection coating (BARC) layer 118 is selectively formed on the sacrificial pattern layer 116. The BARC layer 118 can be made of, for example, organic material or inorganic material. The method for forming BARC layer 118 can be, for example, spin coating.

Moreover, a patterned photoresist layer 120 is formed on the BARC layer 118. The patterned photoresist layer 120 can be made of, for example, positive photoresist material or negative photoresist material. The method for forming the patterned photoresist layer 120 includes, for example, forming a photoresist material layer (not shown) on the BARC layer 118, and then performing an exposure process and a development process on the photoresist material layer. The ratio of a line width of the patterned photoresist layer 120 to a line space of the patterned photoresist layer 120 is about 1:1, for example. The line width of the patterned photoresist layer 120 is, for example, the minimum line width of the photolithography process.

Figure 1B:
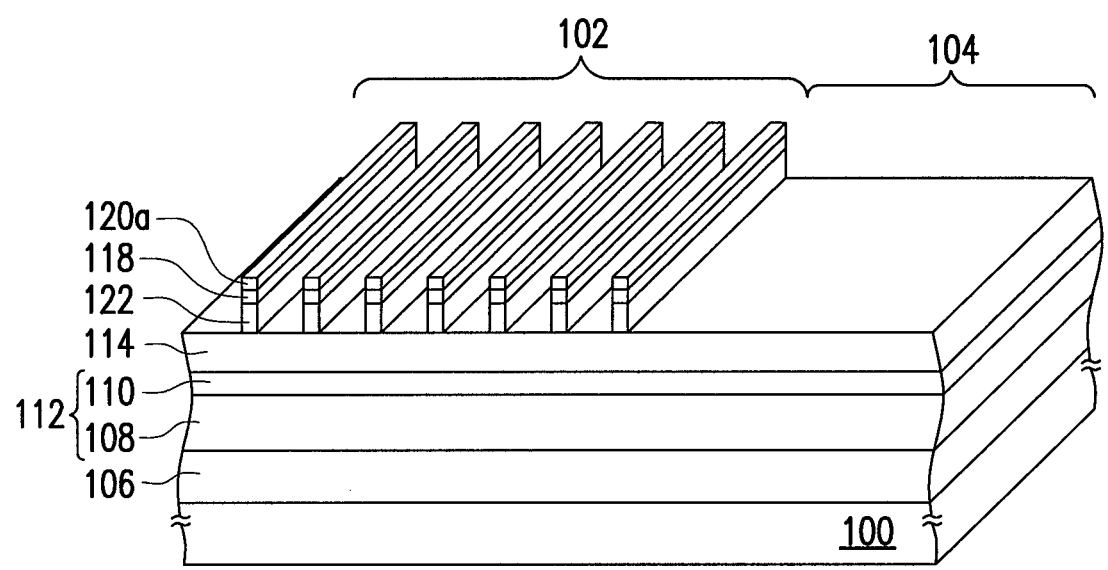

Further, as shown in FIG. 1B, a trim process can be selectively performed on the patterned photoresist layer 120 to form a patterned photoresist layer 120a with a line width smaller than the line width of the patterned photoresist layer 120. The ratio of a line width of the patterned photoresist layer 120a to a line space of the patterned photoresist layer 120a is, for example, larger than 1:1 and smaller than or equal to 1:3. In the present embodiment, the patterned photoresist layer 120a of which the ratio of the line width to the line space is 1:3 is taken as an exemplar for description.

Then, by using the patterned photoresist layer 120a as a mask, a portion of the BARC layer 118 and a portion of the sacrificial pattern layer 116 are removed to form a plurality of sacrificial patterns 122 in the dense region 102, wherein there is an opening 124 between two adjacent sacrificial patterns 122. The method for removing the portion of the BARC layer 118 and the portion of the sacrificial pattern layer 116 can be, for example, dry etch process.

Figure 1C:
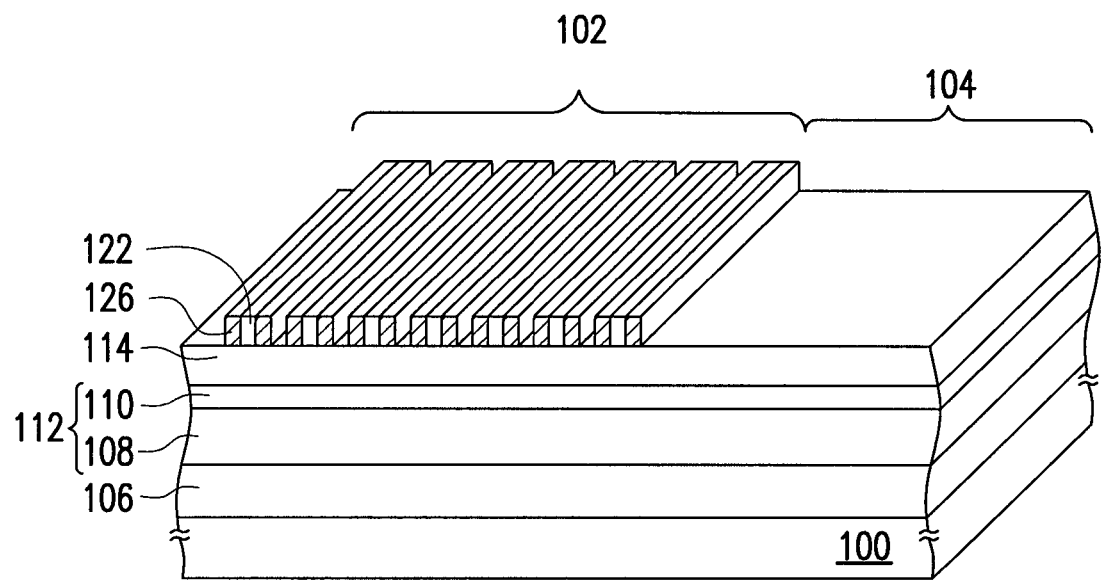

Also, as shown in FIG. 1C, the patterned photoresist layer 120a and the BARC layer 118 are removed. The method for removing the patterned photoresist layer 120a can be, for example, dry photoresist removing method. In addition, the BARC layer 118 can be removed in the step of removing the patterned photoresist layer 120a.

Then, a spacer 126 is formed on each of two sides of each of the sacrificial patterns 122. The etch selectivity of the spacers 126 can be, for example, different from the etch selectivity of the sacrificial patterns 122. The spacers 126 can be made of, for example, silicon oxide or silicon nitride. In the present embodiment, the spacers 126 made of silicon nitride is used as an exemplar for description. The method for forming the spacers 126 includes, for example, forming a spacer material layer (not shown) conformal to and covering the sacrificial patterns 122, and then performing an etch back process on the spacer material layer.

Figure 1D:
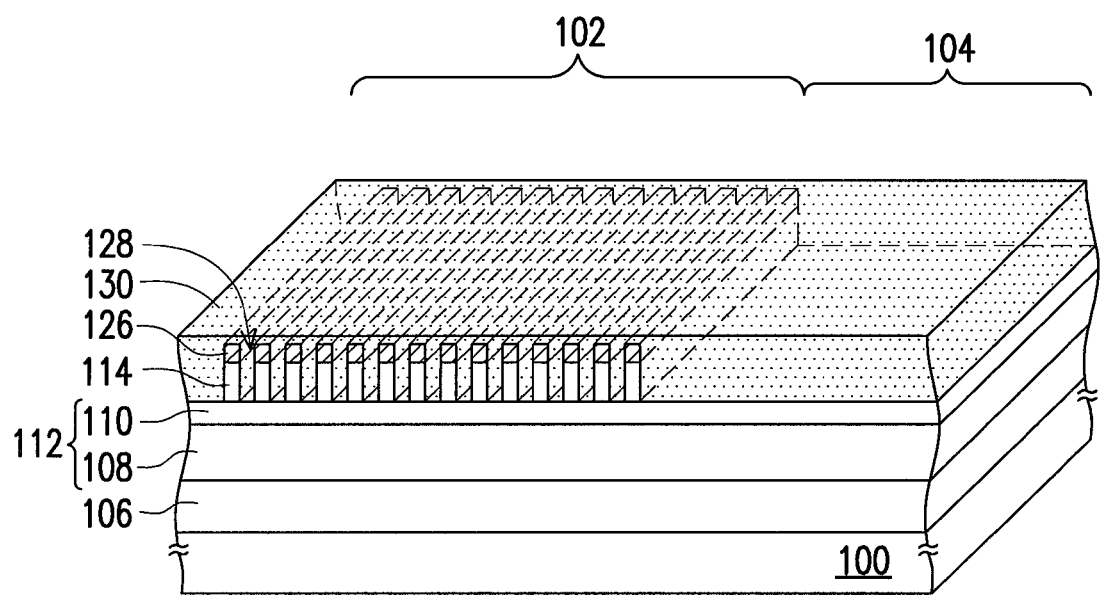

In addition, as shown in FIG. 1D, the sacrificial patterns 122 are removed to from an opening 128 between two adjacent spacers 126. The method for removing the sacrificial patterns 122 can be, for example, dry etch process.

Then, the openings 128 are extended into the hard mask layer 114. The method for extending the openings 128 into the hard mask layer 114 includes, for example, performing the dry etch process to remove a portion of the hard mask layer 114 exposed by the spacers 126 which is used as a mask.

It should be noticed that, after the openings 128 are extended into the hard mask layer 114, the spacers 126 may be completely consumed or a portion of the spacers 126 may remain. Since the spacers 126 and the hard mask layer 114 are used to be the mask layer for transferring patterns in the following process steps, it is not necessary to intentionally remove the spacers 126 if the portion of the spacers 126 remains after the openings 128 are extended into the hard mask layer 114. In other embodiments, after the openings 128 are extended into the hard mask layer 114, the spacers 126 can be removed. However, in the embodiment in which no hard mask layer 114 is formed, the spacers 126 are regarded as the mask layer for transferring the patterns in the following process steps.

Moreover, a planar layer 130 is formed to fill up the openings 128. The planar layer 130 can be, for example, a BARC layer and can be made of, for example, organic material or inorganic material. The method for forming the planar layer 130 can be, for example, spin coating.

Figure 1E:
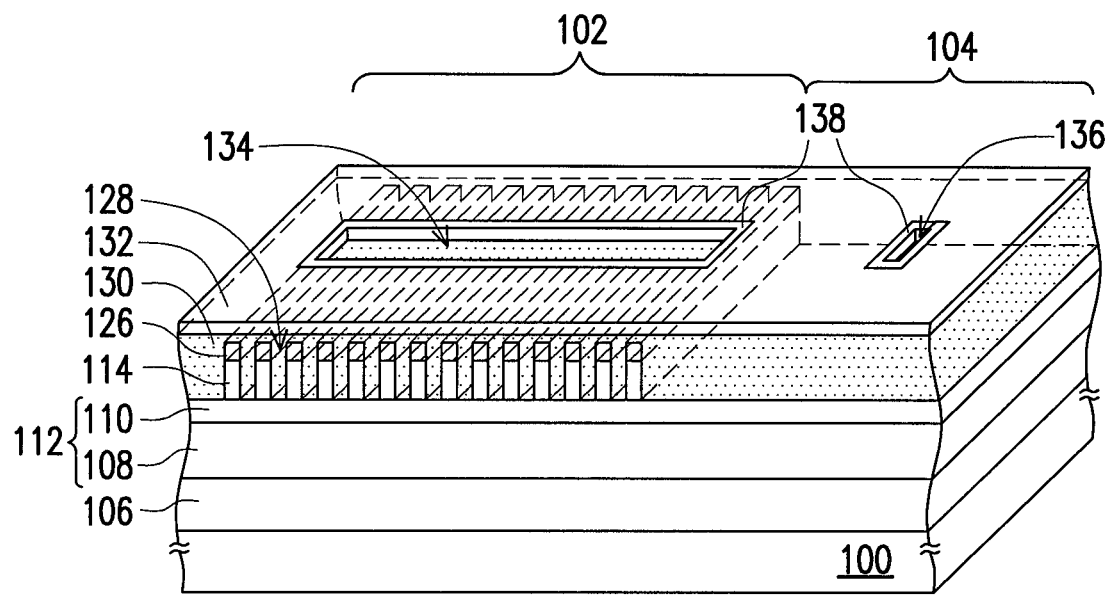

Thereafter, as shown in FIG. 1E, a patterned photoresist layer 132 is formed on the planar layer 130. The patterned photoresist layer 132 has a slit 134 and an opening 136. The slit 134 exposes a portion of the planar layer 130 in the dense region 102 and the opening 136 exposes a portion of the planar layer 130 in the isolation region 104. The width of the opening 136 can be, for example, the minimum line width of the photolithography process.

Then, a resolution enhancement lithography assisted by chemical shrink (RELACS) layer 138 can be selectively formed on the inner wall of the slit 134 and on the inner wall of the opening 136 respectively. The RELACS layer 138 can be made of, for example, material composed of water soluble resin and crosslinker. The RELACS layer 138 can shrink the width of the opening 136 to be half of the minimum line width of the photolithography process. The method for forming the RELACS layer 138 includes, for example, forming a RELACS material layer (not shown) to cover the patterned photoresist layer 132, and then removing a portion of the RELACS material layer which does not react with the patterned photoresist layer 132.

It should be noticed that the RELACS layer 138 is also formed on the top surface of the patterned photoresist layer 132. Nevertheless, in order to clearly show the width of the opening 136 is shrunk, the portion of the RELACS layer 138 formed on the top surface of the patterned photoresist layer 132 is not shown in FIG. 1E.

Additionally, although, in the previous embodiment, a shrink process performed on the opening 136 is the RELACS process which is a chemical shrink process, the present invention is not limited thereto. In other embodiments, the shrink process performed on the opening 136 can be the photoresist expanding process or the low temperature thin film process which are physical shrink processes.

Figure 1F:
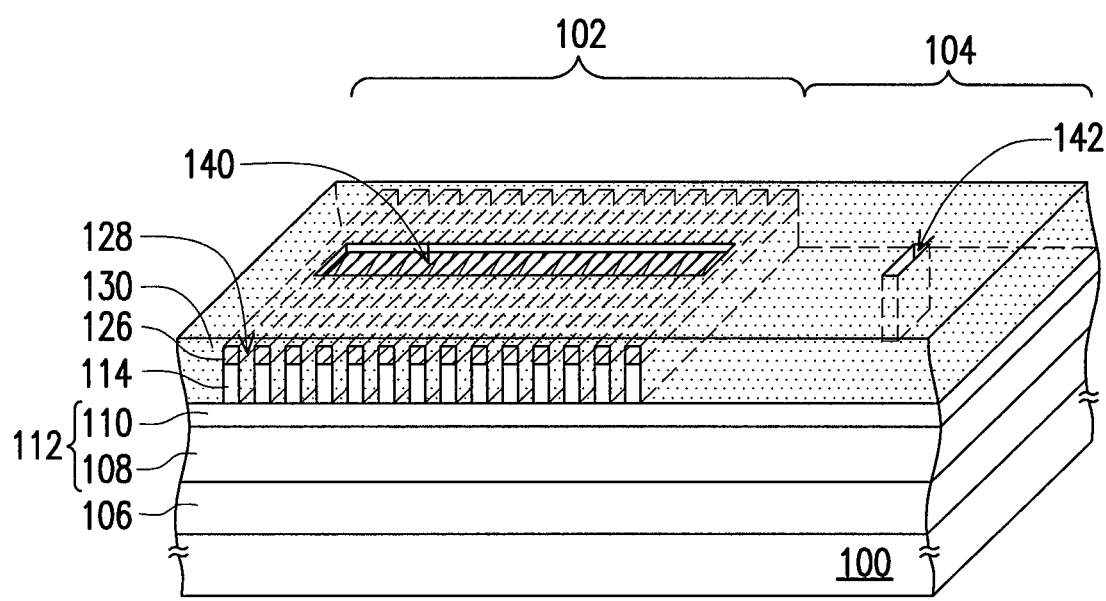

Then, as shown in FIG. 1F, by using the patterned photoresist layer 132 and the RELACS layer 138 as a mask, the portions of the planar layer 130 exposed by the slit 134 and the opening 136 are removed to form a slit 140 in the planar layer 130 in the dense region 102 and to form an opening 142 in the planar layer 130 in the isolation region 104 respectively. The slit 140 exposes a portion of the hard mask layer structure 112 under the openings 128 and the opening 142 exposes a portion of the hard mask layer structure 112.

Thereafter, the patterned photoresist layer 132 and the RELACS layer 138 can be selectively removed. The method for removing the patterned photoresist layer 132 can be, for example, dry photoresist removing method. Moreover, the RELACS layer 138 can be removed in the step of removing the patterned photoresist layer 132.

Figure 1G:
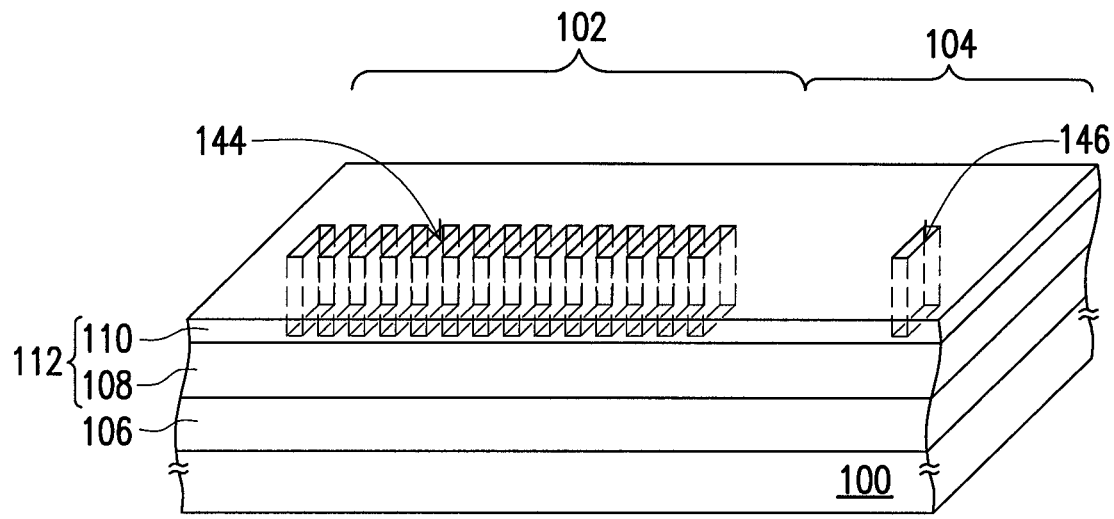

As shown in FIG. 1G, by using the planar layer 130 and the spacers 126 and the hard mask layer 114 which are exposed by the slit 140 as the mask, a portion of the hard mask layer structure 112 exposed by the slit 140 is removed to form openings 144 in the hard mask layer structure 112. Meanwhile, a portion of the hard mask layer structure 112 exposed by the opening 142 is removed to form an opening 146 in the hard mask layer structure 112. In the present embodiment, during the formations of the openings 144 and the opening 146, the planar layer 130, the spacers 126 and the hard mask layer 114 may be completely consumed or can be removed by performing additional process steps. The methods for removing the planar layer 130, the spacers 126 and the hard mask layer 114 are well known by the people skilled in the art and are not described herein.

It should be noticed that although both of the hard mask layer 110 and the hard mask layer 108 in the hard mask layer structure 112 are shown in FIG. 1G, the present invention is not limited thereto. In other embodiments, the hard mask layer 110 may be completely consumed in the process step for forming the openings 144 and the opening 146 or can be removed by performing additional process steps.

Figure 1H:
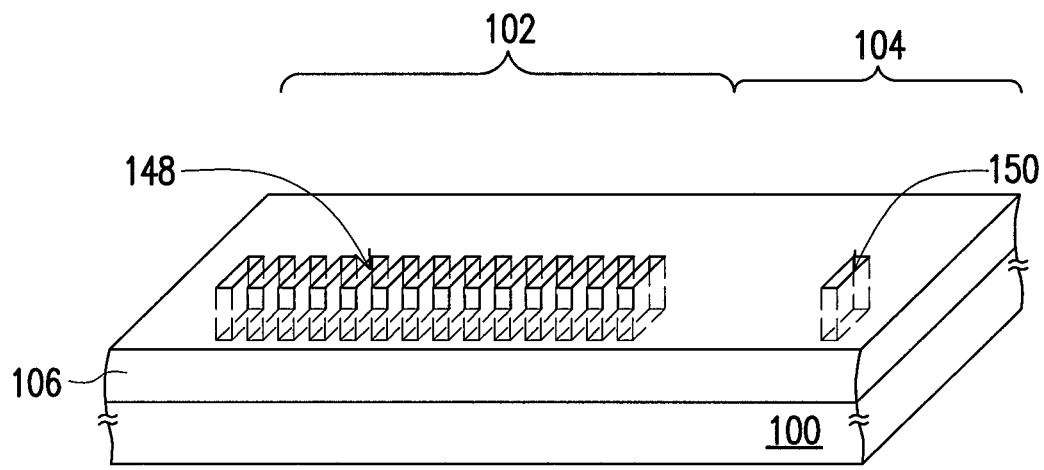

Then, as shown in FIG. 1H, by using the hard mask structure 112 as a mask, portions of the material layer 106 exposed by the openings 144 and the opening 146 are removed to form openings 148 and an opening 150 in the material layer 106. The openings 148 and the opening 150 are used as, for example, contact holes. The width of each of the openings 148 and the opening 150 is half of the minimum line width of the photolithography process, for example. The method for removing the portion of the material layer 106 can be, for example, dry etch process.

Moreover, the hard mask layer structure 112 is removed. The hard mask layer structure 112 may be completely consumed in the process step for forming the openings 148 and the opening 150 or can be removed by performing additional dry etch process.

Noticeably, in the embodiment in which no hard mask layer structure 112 is formed, the planar layer 130 and the spacers 126 and the hard mask layer 114 which are exposed by the slit 140 are used as the mask to form the openings 148 and the opening 150 directly in the material layer 106.

According to the aforementioned embodiments, in the method for forming the contact holes provided by the present invention, since the planar layer 130 is formed to fill up the openings 128 after the openings 128 are formed, the patterned photoresist layer 132 for defining the slit 140 is formed on the smooth planar layer 130 in the photolithography process for forming the slit 140. Thus, the reliability of the patterned photoresist layer 132 is relatively better and the ability for controlling the critical dimension of the contact holes is improved.

Accordingly, the aforementioned embodiments include at least advantages shown as followings:

1. The reliability of the method for forming the contact holes provided by the aforementioned embodiment is relatively better.

2. The ability for controlling the critical dimension of the contact holes is enhanced by applying the method for forming the contact holes provided by the aforementioned embodiments.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for forming contact holes, comprising:
   providing a substrate, wherein the substrate includes a dense region and an isolation region;
   forming a material layer on the substrate;
   forming a plurality of sacrificial patterns on the material layer in the dense region, wherein there is a first opening between two adjacent sacrificial patterns;
   forming a spacer on each of two sides of each of the sacrificial patterns, wherein the spacers are separated from each other;
   removing the sacrificial patterns to form a second opening between two adjacent spacers;
   forming a planar layer filling up the second openings;
   forming a first straight narrow opening in the planar layer, wherein the first straight narrow opening exposes a portion of the material layer under the second openings, and the step of forming the first straight narrow opening in the planar layer comprises:
      forming a first patterned photoresist layer on the planar layer, wherein the first patterned photoresist layer has a second straight narrow opening and a fourth opening, the second straight narrow opening exposes a portion of the planar layer in the dense region and the fourth opening exposes a portion of the planar layer in the isolation region; and
      removing the portions of the planar layer exposed by the second straight narrow opening and the fourth opening by using the first patterned photoresist layer as a mask so as to form the first straight narrow opening in the planar layer in the dense region and to form a fifth opening in the planar layer in the isolation region; and
   removing the portion of the material layer exposed by the first straight narrow opening to form a plurality of third openings in the material layer.

2. The method of claim 1, further comprising performing a shrink process on the fourth opening after the step of forming the first patterned photoresist layer and before the step of removing the portions of the planar layer.

3. The method of claim 2, wherein the shrink process includes a resolution enhancement lithography assisted by chemical shrink (RELACS) process, a photoresist expanding process or a low temperature thin film process.

4. The method of claim 2, wherein during the step of removing the portion of the material layer exposed by the first straight narrow opening, a portion of the material layer exposed by the fifth opening is removed to form a sixth opening in the material layer.

5. The method of claim 1, further comprising forming a hard mask layer on the material layer after the material layer is formed and before the sacrificial patterns are formed.

6. The method of claim 5, further comprising extending the second openings into the hard mask layer.

7. The method of claim 5, further comprising forming a hard mask layer structure on the material layer after the material layer is formed and before the hard mask layer is formed.

8. The method of claim 7, further comprising forming a plurality of seventh openings in the hard mask layer structure for forming the third openings.

9. The method of claim 7, wherein the hard mask layer structure comprises a single-layered hard mask layer or a multi-layered hard mask layer.

10. The method of claim 1, wherein the step of forming the sacrificial patterns comprises:
    forming a sacrificial pattern layer on the material layer;
    forming a second patterned photoresist layer on the sacrificial pattern layer; and
    removing a portion of the sacrificial pattern layer by using the second patterned photoresist layer as a mask.

11. The method of claim 10, further comprising performing a trim process on the second patterned photoresist layer.

12. The method of claim 11, wherein a ratio of a line width of the second patterned photoresist layer to a line space of the second patterned photoresist layer, after the trim process is performed on the second patterned photoresist layer, is larger than 1:1 and smaller than or equal to 1:3.

13. The method of claim 10, further comprising forming a bottom anti-reflection coating layer on the sacrificial pattern layer after the sacrificial pattern layer is formed and before the second patterned photoresist layer is formed.

* * * * *